United States Patent
Zhang et al.

(10) Patent No.: US 8,538,115 B2
(45) Date of Patent: Sep. 17, 2013

(54) COIL COMPRESSION FOR THREE DIMENSIONAL AUTOCALIBRATING PARALLEL IMAGING WITH CARTESIAN SAMPLING

(75) Inventors: Tao Zhang, Stanford, CA (US); Michael Lustig, Berkeley, CA (US); Shreyas S. Vasanawala, Stanford, CA (US); John M. Pauly, Stanford, CA (US)

(73) Assignees: The Board of Trustees of the Leland Stanford Junior University, Palo Alto, CA (US); The Regents of the University of California, Oakland, CA (US)

( * ) Notice: Subject to any disclaimer, the term of this patent is extended or adjusted under 35 U.S.C. 154(b) by 210 days.

(21) Appl. No.: 13/211,905

(22) Filed: Aug. 17, 2011

(65) Prior Publication Data
US 2013/0044960 A1    Feb. 21, 2013

(51) Int. Cl.
*G06K 9/00* (2006.01)
*G06K 9/32* (2006.01)

(52) U.S. Cl.
USPC .......................................... 382/131; 382/294

(58) Field of Classification Search
USPC .................. 382/131, 132, 154, 232, 276, 294; 600/407, 417, 419; 364/413.14; 324/309, 324/322
See application file for complete search history.

(56) References Cited

U.S. PATENT DOCUMENTS

| | | | |
|---|---|---|---|
| 4,994,746 A * | 2/1991 | Panosh | 324/322 |
| 5,531,520 A * | 7/1996 | Grimson et al. | 382/131 |
| 6,675,037 B1 * | 1/2004 | Tsekos | 600/417 |
| 6,841,998 B1 | 1/2005 | Griswold | |
| 6,943,549 B2 * | 9/2005 | Matsuo et al. | 324/309 |
| 7,692,425 B2 | 4/2010 | Brau et al. | |
| 7,826,883 B2 * | 11/2010 | Hibner et al. | 600/407 |
| 2013/0044960 A1 * | 2/2013 | Zhang et al. | 382/232 |

OTHER PUBLICATIONS

Brau et al., "Comparison of Reconstruction Accuracy and Efficiency Among Autocalibrating Data-Driven Parallel Imaging Methods," Magn Reson Med., 2008; Magn Reson Med 59(2), pp. 382-395 (2008).

Zhang et al., "Array Compression for 3D Cartesian Sampling," ISMRM 19th Scientific Meeting & Exhibition, p. 2857, Montreal, 2011.

* cited by examiner

*Primary Examiner* — Amir Alavi
(74) *Attorney, Agent, or Firm* — Beyer Law Group LLP

(57) ABSTRACT

A three dimensional image, in a phased array magnetic resonance imaging (MRI) system is provided. Three dimensional k-space data within an auto calibration signal (ACS) region and outside the ACS region are acquired. The k-space data within the ACS region are converted into hybrid space ACS data. Compression matrices and alignment matrices of the compression matrices for the hybrid space ACS data are found along a readout direction. Alignment matrices are multiplied to the compression matrices to achieve the properly-aligned compression matrices along the readout direction. All k-space data are converted into hybrid space. The properly-aligned compression matrices are applied to the hybrid space data to provide compressed data with fewer channels. The compressed data are used to form a three dimensional image.

19 Claims, 8 Drawing Sheets

COIL COMPRESSION FOR THREE DIMENSIONAL AUTOCALIBRATING PARALLEL IMAGING WITH CARTESIAN SAMPLING

GOVERNMENT RIGHTS

This invention was made with Government support under contract P41 RR09784 awarded by the National Institutes of Health and under contract R01 EB009690 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Compared with other modalities, such as X-ray, CT and ultrasound, MRI takes longer time, sometimes several minutes, for data acquisition to generate clinically useful images. Undesirable imaging artifacts may appear due to the long scan time.

Three dimensional (3D) MRI acquisition has the benefits including high available signal-to-noise ratio (SNR), full-volume coverage, and arbitrary image reformats. However, due to the relatively long scan time, the clinical application of 3D data acquisition was limited. With the development of parallel imaging (PI) and compressed sensing (CS) techniques, MRI data acquisition was significantly accelerated, which made 3D acquisition clinically feasible. PI uses a phased array with multiple receiving coils to simultaneously acquire data. The spatially varying coil sensitivities of the phased array are used to partially replace the traditional k-space encoding, therefore scan time is reduced. CS randomly undersamples data acquisition in k-space, and achieves image reconstruction by solving a nonlinear optimization problem that exploits the transform sparsity of the image. Combining PI and CS, higher acceleration in data acquisition can be achieved. As scan time is greatly reduced, the reconstruction computation by PI, CS or the combination of the two becomes significant, especially for 3D datasets.

U.S. Pat. No. 6,841,998 by Griswold, issued Jan. 11, 2005 entitled "Magnetic Resonance Imaging Method And Apparatus Employing Partial And Parallel Acquisition, Wherein Each Coil Produces A Complete K-Space Datasheet," which is incorporated herein by reference for all purposes, also describes a GRAPPA based reconstruction. U.S. Pat. No. 7,692,425 by Brau, issued Apr. 6, 2010, entitled "Method and apparatus of multi-coil MR imaging with hybrid space calibration," which is incorporated herein by reference for all purposes, discloses a parallel imaging system and Autocalibrating Reconstruction for Cartesian Sampling (ARC), which uses compressed sensing techniques to reconstruct an MR image.

SUMMARY OF THE INVENTION

In accordance with the invention, a computer implemented method for providing a three dimensional image, in a phased array magnetic resonance imaging (MRI) system is provided. Three dimensional Cartesian k-space data within an auto calibration signal (ACS) region and outside the ACS region are acquired. The k-space data within the ACS region are converted into hybrid space ACS data. Compression matrices and alignment matrices of the compression matrices for the hybrid space ACS data are found along a readout direction. Alignment matrices are multiplied to the compression matrices to achieve the properly-aligned compression matrices along the readout direction. All k-space data are converted into hybrid space data. The properly-aligned compression matrices are applied to the hybrid space data to provide compressed data with fewer channels. The compressed data are used to form a three dimensional image.

In accordance with another manifestation of the invention, a computer implemented method for providing a three dimensional image, in a phased array magnetic resonance imaging (MRI) system is provided. Three dimensional Cartesian k-space data within an auto calibration signal (ACS) region and outside the ACS region are acquired, where within the ACS region the k-space data are fully sampled and where outside of the ACS region the k-space data are fully sampled in a readout direction but under sampled in both phase encoding directions. The k-space data within the ACS region are converted into hybrid space ACS data. Compression matrices and alignment matrices of the compression matrices for the hybrid space ACS data are found along a readout direction. Alignment matrices are multiplied to the compression matrices to achieve the properly-aligned compression matrices along the readout direction. All k-space data are converted into hybrid space data. The properly-aligned compression matrices are applied to the hybrid space data to provide compressed data with fewer channels. The compressed data are used to form a three dimensional image using autocalibrating parallel imaging or compressed sensing methods to reconstruct the compressed data.

The invention and objects and features thereof will be more readily apparent from the following detailed description and appended claims when taken with the drawings.

DETAILED DESCRIPTION OF ILLUSTRATED EMBODIMENTS

Large phased arrays with 32 or more receiving coils have been developed. These large arrays enable faster data acquisition with high SNR, but the reconstruction of large 3D datasets, as well as data storage, becomes problematic. To reduce the computation cost of large phased arrays, the technique of coil compression can be applied. Coil compression linearly combines the raw data from multicoils into fewer virtual coils. Since the reconstruction computation is highly dependent on the number of coils, the computation time is largely reduced after coil compression. The coil compression method was first applied in the hardware, known as the MRI eigencoil. The original phased array can be linearly combined into fewer eigencoils using the knowledge of the noise covariance of the phased array. However, since this hardware combiner does not take into consideration the spatially varying coil sensitivities or the received data, the compression may not be optimal.

Software coil compression provides more flexibility and high accuracy. Two coil compression techniques have been developed. The first type of coil compression requires the explicit knowledge of the coil sensitivities. The coil compression is achieved by optimizing SNR in a region of interest (ROI) in the reconstructed image. This type of coil compression is suitable for sensitivity-based PI reconstructions like SENSE. The other type of coil compression calculates the optimal coil combination by principal component analysis (PCA) solely based on the acquired data. This method is fast and does not require coil sensitivity measurement, which works well with autocalibrating PI and CS. Both software coil compression methods have been well developed for 2D acquisition. For 3D datasets, the direct extension of these coil compression methods is currently applied. The original coils were combined by the same linear weights for the entire 3D dataset. Since the coil sensitivities vary in 3D, this direct extension needs more virtual coils to achieve a negligible compression loss. Therefore the reconstruction time reduction is compromised.

Figure 1:
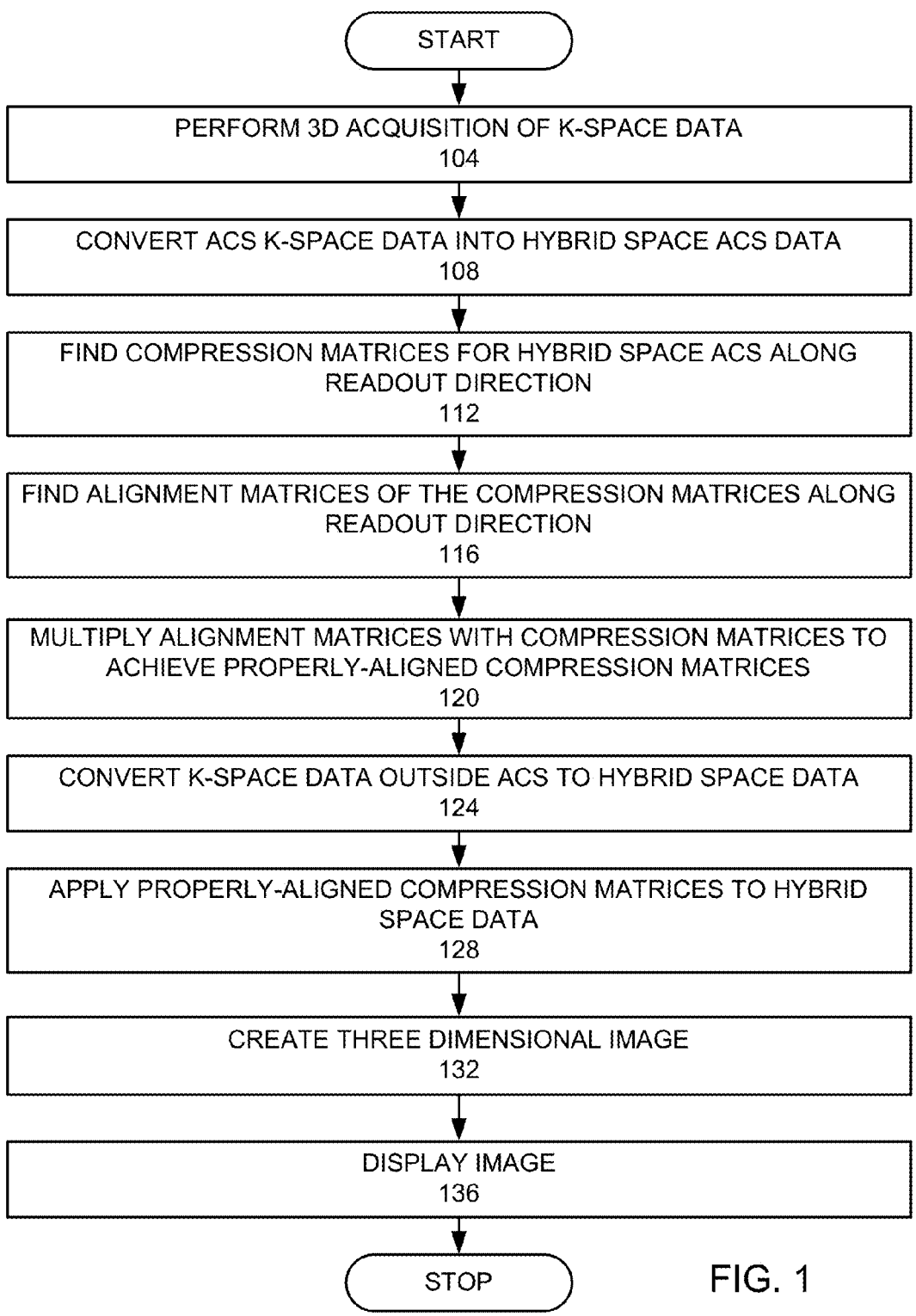
FIG. 1 is a flow chart of an embodiment of the invention.

To facilitate the understanding of the invention, FIG. 1 is a high level flow chart of an embodiment of the invention. A 3D acquisition of k-space data is performed with a region within an auto calibration signal (ACS) and a region outside of the ACS (step 104). A first direction is along a read out direction, which is also known as a frequency encoding direction and designated as $k_x$. A second direction and a third direction, which are phase encoding directions $k_y$ and $k_z$ provide two other dimensions for the 3D acquisition in k-space with Cartesian sampling. In a preferred embodiment, the region within the ACS is fully sampled and the region outside of the ACS is under sampled. In this preferred embodiment, the region outside of the ACS is fully sampled in the $k_x$ (readout or frequency encoding) direction and undersampled in the $k_y$ and $k_z$ (phase encoding) directions. The ACS k-space data are converted into hybrid space ACS data (step 108). In the preferred embodiment the hybrid space ACS data are in the form of $(x,k_y,k_z)$, so that the readout direction is converted to image space. Compression matrices are found for the hybrid space ACS data along the readout direction (step 112). Alignment matrices are found for the hybrid space ACS data along the readout direction (step 116). The alignment matrices and compression matrices are multiplied to achieve properly-aligned compression matrices along the readout direction (step 120). All k-space data are converted into hybrid space (step 124). The properly-aligned compression matrices are applied to the hybrid space data to provide compressed data with fewer channels (step 128). The compressed data are used to form a 3D image (step 132). The image is displayed (step 136).

An embodiment of the invention provides an effective data-based coil compression method for 3D Cartesian acquisition. To minimize the number of the virtual coils (hence the reconstruction time), a slice-by-slice coil compression is provided. Optimal coil compressions are performed at different spatial locations. Then location-dependent coil compressions are carefully aligned so that the whole virtual coils have smooth coil sensitivities. The proper alignment of the compression matrices makes the direct reconstruction of autocalibrating PI and CS possible, which significantly reduces the computation cost. Based on in vivo 32-channel pediatric coil data, in an embodiment of the invention, it is demonstrated that by a slice-by-slice coil compression, similar image quality relative to conventional multicoil reconstruction can be achieved using only 6 virtual coils. Moreover, the highly reduced reconstruction time is clinically practical.

Theory

In a typical PI system, multicoils are used to simultaneously acquire data. Different coil sensitivities of the phased array can be used to partly replace the traditional k-space encodings. Usually the coil sensitivities are not orthogonal to each other. It limits the possible acceleration factor of the PI system, and also introduces data redundancy in multicoil data.

Coil compression is a technique of reducing this data redundancy by combining the original data from multicoils into fewer virtual coils. Assume $N_c$ is the original number of coils in data acquisition. At each location r, either in image space, hybrid space, or k-space, define a vector $v(r)=[v_1(r), v_2(r), \ldots, v_{N_c}(r)]$ that represents data at this location from all the original coils. Let P be a $N_c \times N_c$ orthogonal matrix, coil compression can be formed as the following problem:

$$\begin{aligned} &\text{minimize } N'_C \\ &\text{subject to } \quad v'(r) = v(r)P, \\ &\qquad\qquad\quad P\,P^H = P^H\,P = I, \\ &\qquad\qquad\quad |v'_i(r)| < \epsilon,\, i = N'_C + 1, \ldots, N_c \end{aligned} \qquad (1)$$

where H is the conjugate transpose operator of a matrix, $v'(r)=[v'_1(r), v'_2(r), \ldots, v'_{N_c}(r)]$ is the vector at the same location from virtual coil 1 to $N_c$, and $N'_C$ is the number of effective virtual coils. In this formulation, the orthogonal matrix P transforms the original coils into another set of virtual coils, where only the first $N'_C$ virtual coils contain non-negligible signals. If v(r) represents signals in the image domain, then it is easy to show that the sum of squares of the $N_c$ original coils (I(r)) and that of the first $N'_C$ virtual coils (I'(r)) are equal.

$$I(r) = \sqrt{\sum_{i=1}^{Nc} |v_i(r)|^2} = \|v(r)\|_2 = \|v(r)P\|_2 = \qquad (2)$$

$$\sqrt{\sum_{i=1}^{Nc} |v'_i(r)|^2} = \sqrt{\sum_{i=1}^{N'_c} |v'_i(r)|^2} = I'(r)$$

If matrix A represents the first $N'_C$ columns of matrix P and the data vector v'(r) is truncated to the first $N'_C$ components, coil compression can also be formulated as:

$$v'(r) = v(r)A \qquad (3)$$

where the problem is to find the coil compression matrix A. Since the set of the virtual coils and the set of the original coils span the same space, each original coil is also a linear combination of the virtual coils:

$$v(r) = v'(r)B \qquad (4)$$

where B is a $N'_C \times Nc$ decoupling matrix. It's obvious that BA is a $N'_C \times N'_C$ identity matrix.

There are two ways to find the optimal compression matrix: if the coil sensitivities are known, sensitivity-based coil compression can be calculated to achieve optimal SNR; for autocalibrating PI reconstruction and CS, data-based coil compression is more suitable, which does not require the explicit knowledge of the coil sensitivities. In data-based coil compression, the compression matrix A can be found by a principle component analysis of the acquired data. One good property of this compression matrix is that $A^H A = I$, or equivalently $B = A^H$.

If the noise covariance N of the phased array is available, the data vector can be prewhitened first before coil compression to achieve maximal SNR, $$v_{pw}(r) = v(r)N^{-1/2} \qquad (6)$$

3D Coil Compression

For a 3D dataset acquired using Cartesian sampling, the easiest way of applying coil compression is to use the same compression matrix A for the entire 3D datasets. This is the direct extension of coil compression for 2D datasets. However, since the coil sensitivities vary spatially in 3D, the data redundancy also changes in 3D. Therefore a single compression matrix cannot well incorporate this data redundancy variation. As a result, more virtual coils will be needed. To minimize the number of the virtual coils, a slice-by-slice coil compression can be applied instead. Normally for 3D Cartesian sampling, the frequency encoding direction is fully sampled; the slice-by-slice coil compression can thus be applied in the hybrid space (x, $k_y$, $k_z$). One slice represents a specific location in x direction, where a compression matrix is found to reduce the data redundancy in that slice. Specifically, assume the number of frequency encodes, the number of phase encodes along y and z are $N_x$, $N_y$, and $N_z$ respectively; the number of autocalibrating signals (ACS) is $N_{ay}$ in $k_y$ direction, $N_{az}$ in $k_z$ direction and in total $N_t (N_{ay} \times N_{az})$. At each slice i (i=1, 2, ..., $N_x$), the corresponding compression matrix $A^i$ can be calculated by singular value decomposition (SVD) in the following steps.

1. At the ith slice, reformat the ACS in the hybrid space from each original coil into vectors $X^i_1, \ldots, X^i_{Nc}$. Define matrix $X^i = [X^i_1, X^i_2, \ldots, X^i_{Nc}]$.
2. Perform SVD of $X^i$:

$$X^i = U^i \Sigma^i (V_i)^H \qquad (7)$$

where $V^i$ is the $N_c \times N_c$ unitary input matrix. The necessary number of the virtual coils $N'_c$ can be determined by thresholding the singular values or empirically pre-defined before coil compression. Assume the singular values $\Sigma^i$ in are in a descending order. Take the first $N'_c$ columns of $V^i$ to form matrix $V^i_A$. Then the compression matrix $A^i$ is initialized as $V^i_A$.

3. Repeat Step 1 and 2 until compression matrices are calculated for all slices.

In fact, for each slice, the compression matrix $A^i$ is not unique. Let $P^i$ be any $N'_c \times N'_c$ orthogonal matrix. Then $A_i$ can be obtained by:

$$A^i = V^i_A P^i \qquad (8)$$

Directly using the SVD input matrix $V^i_A$ ($P^i = I$) as the compression matrix $A^i$ is likely to introduce non-smooth compression along x direction. That is, the compression matrices are not accurately aligned in that direction due to the arbitrary SVD results. In that case, the sensitivities of the virtual coils are not smooth, which leads to the failure of autocalibrating PI reconstruction, in particular the calibration step. To address this problem, we need to find an orthogonal matrix $P^i$ at each slice, so that the resulting compression matrices $A^i$ from Eq. (8) are smooth in x direction. This alignment can be achieved by solving the following optimization problem:

$$\text{minimize} \sum_{i=2}^{N_x} \|A^i - A^{i-1}\|_F^2 \qquad (9)$$

$$\text{subject to } A^i = V^i_A P^i,$$

$$P^i(P^i)^H = (P^i)^H P^i = I, (i = 1, 2, \ldots, N_x)$$

where the variables are $A^i$ and $P^i$, and $\|A^i - A^{i-1}\|_F$ is the Frobenius norm of matrix ($A^i - A^{i-1}$). This problem does not have a unique solution as well. But if we set $P^i = I$ at a specific slice i, the optimal solution of $P^i$ at the other slices is then fixed. For simplicity, assume $P^1 = I$. It can be shown that this problem has an analytical solution, as will be shown below. The orthogonal correction matrices for slice 2 to $N_x$ can be found sequentially by the following steps:

1. Assume $P^{i-1}$ (and $A^{i-1}$) is known at slice i−1, and $P^i$ is to be solved for slice i. Define matrix $C^i = (A^{i-1})^H V^i_A$.
2. Perform SVD of matrix $C^i$ (size: $N'_c \times N'_c$).

$$C^i = U^i_C \Sigma^i_C (V^i_C)^H \qquad (10)$$

3. Set $P^i = V^i_C (U^i_C)^H$ and $A^i = V^i_A P^i$. This $P^i$ minimizes $\|A^i - A^{i-1}\|_F^2$.
4. Repeat from Step 1 till the alignment is done for all slices.

As each $P^i$ minimizes $\|A^i - A^{i-1}\|_F^2$, $$\sum_{i=2}^{N_x} \|A^i - A^{i-1}\|_F^2$$

is ultimately minimized. With the compression matrices carefully aligned, the coil compression can be simply performed according to Eq. 3 at each x location. The final step is to take a Fourier transform of the virtual coil data along x direction. By now the original 3D data has been compressed into fewer virtual coils.

To show the existence of an analytical solution, the objective function in Eq. (9) can be minimized sequentially at each slice. Assume $P^{i-1}$ (and is known at slice i−1, then minimize $\|A^i - A^{i-1}\|_F^2$ can be minimized at slice i.

$$\|A^i - A^{i-1}\|_F^2 = \|V_A^i P^i - A^{i-1}\|_F^2 \quad (11)$$
$$= Tr[(V_A^i P^i - A^{i-1})^H (V_A^i P^i - A^{i-1})]$$
$$= Tr[(V_A^i P^i)^H V_A^i P^i] + Tr[(A^{i-1})^H A^{i-1}] - Tr[2(A^{i-1})^H V_A^i P^i]$$
$$= Tr[(V_A^i)^H V_A^i] + Tr[(A^{i-1})^H A^{i-1}] - 2Tr[C^i P^i]$$
$$= Tr[(V_A^i)^H V_A^i] + Tr[(A^{i-1})^H A^{i-1}] - 2Tr[U_C^i \Sigma_C^i (V_C^i)^H P^i]$$
$$= Tr[(V_A^i)^H V_A^i] + Tr[(A^{i-1})^H A^{i-1}] - 2Tr[\Sigma_C^i (V_C^i)^H P^i U_C^i]$$

with the use of Eq. (10) and the property of $Tr[M_1 M_2]=Tr[M_2 M_1]$.

To minimize $\|A-A^{i-1}\|_F^2$ is equivalent to maximize $2Tr[\Sigma_C^i (V_C^i)^H P^i U_C^i]$. Define $Q=(V_C^i)^H P^i U_C^i = [q_{ij}]$. Since $V_C^i$, $P^i$, and $U_C^i$ are all orthogonal matrices, then Q is also an orthogonal matrix, and $|q_{ij}| \leq 1$. Define $\Sigma_C^i = \mathrm{diag}(\sigma_{11}, \sigma_{22}, \ldots, \sigma N_C^l, N_C^l)$, then $$Tr\left[\sum_C^i (V_C^i)^H P^i U_C^i\right] = \sum_{k=1}^{N_C^l} \sigma_{kk} q_{kk} \leq \sum_{k=1}^{N_C^l} \sigma_{kk}.$$

To maximize $Tr[\Sigma_C^i Q]$, we have $Q=I$, and $P^i = V_C^i (U_C^i)^H$. Similar calculation can be done sequentially for each slice to minimize $$\sum_{i=2}^{N_x} \|A^i - A^{i-1}\|_F^2.$$

Reconstruction of the Virtual Coils

Any PI and CS methods can be directly applied to the virtual coils for reconstruction. In this embodiment of the invention, ARC and $l_1$-SPIRiT are used for reconstruction as examples. ARC is a coil-by-coil autocalibrating PI reconstruction method. It generally includes two sequential steps in the reconstruction: calibration and data synthesis. The total computation time of ARC is on the order of $N_c^2$, where $N_c$ is the number of coils. $l_1$-SPIRiT is a reconstruction method combining PI and CS. Iterative data synthesis is applied to reconstruct the randomly undersampled data in $l_1$-SPIRiT. The computation of data synthesis is on the order of $N_C^2$; similar to other autocalibrating PI methods, the interpolation weights in $l_1$-SPIRiT can be calculated by a least-square fitting, and then transformed into hybrid space (x, $k_y$, $k_z$) or image space, where the data synthesis is carried out. The computation of calibration in $l_1$-SPIRiT is order of $N_C^3$ by a least-square fitting approach. With coil compression applied on the acquired data, the number of coils is significantly reduced. As a result, the reconstruction is highly accelerated.

Materials and Methods

An embodiment of the invention was implemented on two 3D datasets. Both of them were acquired on a 3T GE Signa Excite scanner (GE Healthcare, Waukesha, Wis., USA) with Cartesian sampling using a 32-channel pediatric coil. The first dataset was fully sampled, and acquired with the following imaging parameters: TE/TR=0.944 ms/3.832 ms, flip angle (FA)=15°, bandwidth (BW)=±64 kHz, FOV=35 cm, slice thickness=2 mm, and matrix size=192×224×184. The second dataset was acquired with 2 by 2 Poisson-disk sampling pattern (reduction factor R z 4). The imaging parameters were: TE/TR=1.128 ms/4.832 ms, FA=15°, bandwidth (BW)=±64 kHz, FOV=38 cm, slice thickness=2 mm, matrix size=308×230×184, and ACS=24×20.

Coil Compression Methods Comparison

The first dataset was first used to compare two coil compression methods: (1) single coil compression (SCC) and (2) slice-by-slice coil compression (SBSCC). For SCC, the same compression matrix was applied to compress the entire 3D dataset. The compression matrix was calculated using the 24×24×24 ACS in the center k-space. For SBSCC, the proposed steps were applied. The compression matrices were carefully aligned to achieve smooth virtual coil sensitivities. In both cases, a number of virtual coils were examined. The sum of squares images of the 32 original coils were used as references. The difference images between the reference and compression results in each case were calculated to represent the compression error. The normalized root mean squared error (nRMSE) was also calculated using the formula:

$$nRMSE(x) = \frac{1}{\max(x) - \min(x)} \sqrt{\frac{1}{N} \sum_{i=1}^{N} (x(i) - \bar{x}(i))^2}.$$

The relationship of nRMSE versus the number of virtual coils was studied in both cases.

Coil Compression Methods Comparison

To demonstrate the importance of compression matrices alignment in SBSCC, 6 virtual coils before and after alignment were compared on the first dataset. Magnitude and phase images of single virtual coils in both cases were studied. The spatially varying compression weights were also compared to demonstrate the effects of the alignment operation.

Reconstruction of the Virtual Coils

To demonstrate the feasibility of combining SBSCC with autocalibrating PI and CS reconstruction, two experiments were carried out. First, the fully sampled dataset was uniformly undersampled by a factor of 2 in both phase encoding directions with ACS 28×28. The total reduction factor R was 3.7. The undersampled dataset was reconstructed by: (1) ARC using the 32 original coils; (2) SBSCC followed by ARC using 6 virtual coils. Differences between the two reconstructions were compared. The theoretical computation cost of each steps in ARC can be found in Brau A, Beatty P, Skare S, Bammer R. "Comparison of Reconstruction Accuracy and Efficiency Among Autocalibrating Data-Driven Parallel Imaging Methods," Magn Reson Med 2008; 59:382-395, which is incorporated by reference for all purposes.

The second randomly undersampled dataset was reconstructed by the following methods: (1) $l_1$-SPIRiT using the 32 original coils; (2) SBSCC followed by $l_1$-SPIRiT using 6 virtual coils. Theoretical computation, numerical example, and actual reconstruction time in each step of $l_1$-SPIRiT were calculated and compared. The difference images between the two reconstructions and nRMSE were calculated.

In the experiment of coil compression methods comparison, two coil compression methods were implemented in MATLAB (The MathWorks, Natick, Mass., USA) on a 8-core 2.8 GHz Intel Xeon E5462 PC. For the ARC reconstructions, SBSCC was implemented in MATLAB, and the ARC routine was implemented in C++. For $l_1$-SPIRiT reconstructions, SBSCC was implemented in C++, and $l_1$-SPIRiT was implemented in CUDA on the same PC with a 30-core, 8-SIMD 1.48 GHz GTX285 GPGPU.

Results

Coil Compression Methods Comparison

Figure 2:
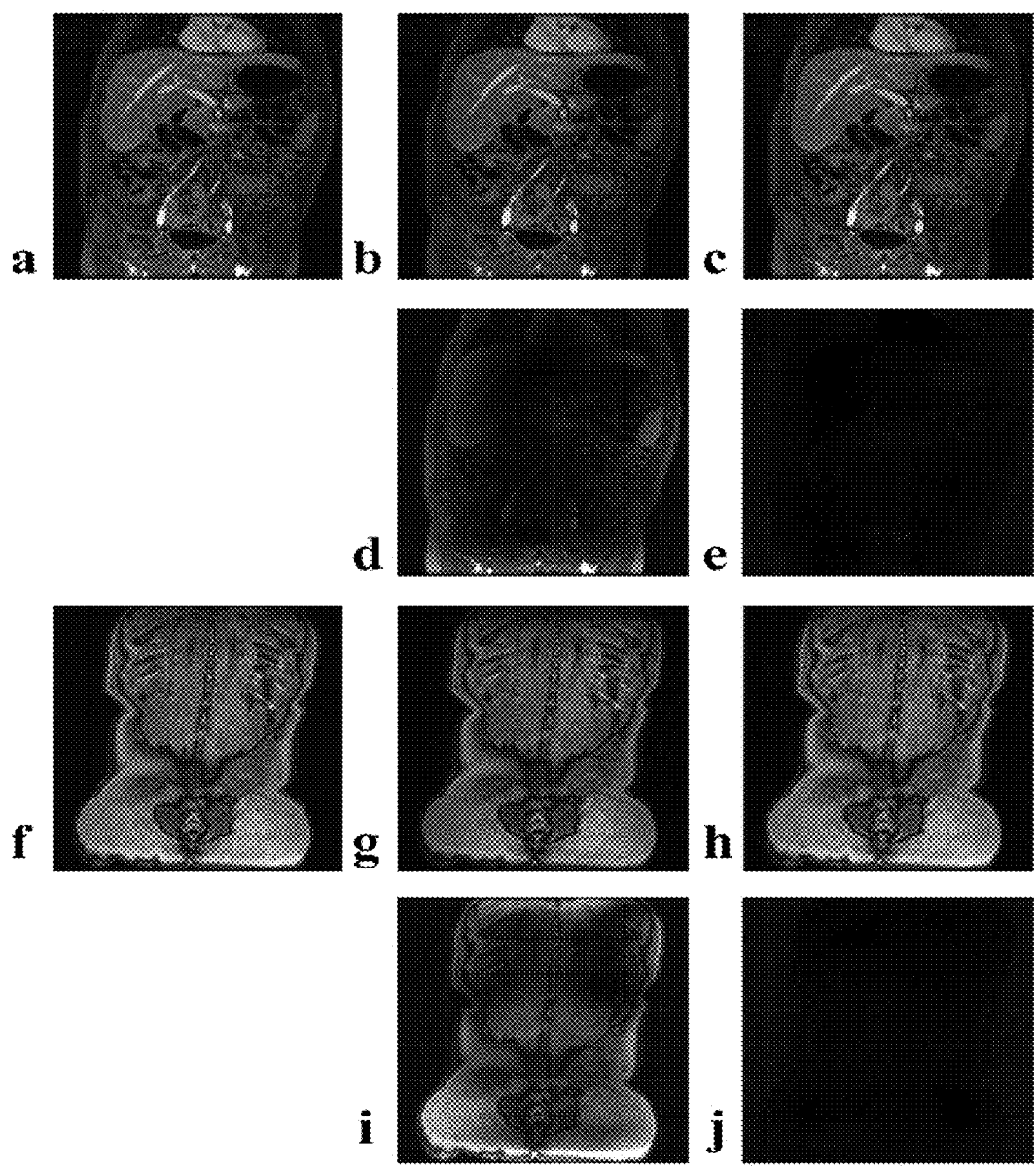
FIGS. 2a-j show the comparison of single coil compression (SCC) and slice-by-slice coil compression (SBSCC).

The number of virtual coils was first set to 6 for both SCC and SBSCC. The experimental results on the first dataset at two coronal locations are shown in FIGS. 2a-j, which shows the comparison of single coil compression (SCC) and slice-by-slice coil compression (SBSCC). The readout direction was Superior/Inferior. The sum of square images were compared at two locations. FIGS. 2a,f show reference images with 32 original coils at the two coronal locations. FIGS. 2b,g show SCC with 6 virtual coils. FIGS. 2c,h show SBSCC with 6 virtual coils. FIGS. 2d,i show difference images between the reference and SCC with 6 virtual coils in FIGS. 2b,g (window/level decreased by 5×). FIGS. 2e,j show difference images between the reference and SBSCC with 6 virtual coils in FIGS. 2c,h (window/level decreased by 5×). Compared with the reference images (FIGS. 2a,f), the results (FIGS. 2b,g) of SCC had more compression loss while the results (FIGS. 2c,h) of SBSCC look very similar to the reference images. The difference images (FIGS. 2d,i) (window/level decreased by 5×) between the SCC images and the reference images further showed large compression error due to the non-optimal coil compression. The difference images (FIGS. 2e,j) (window/level decreased by 5×) between the SBSCC images and the reference images demonstrated the accuracy of SBSCC. The compression error was very small and negligible in SBSCC. The nRMSE values were 0.020 at coronal location 1 and 0.058 at coronal location 2 for SCC, and 0.004 at coronal location 1 and 0.007 at coronal location 2 for SBSCC. SCC had larger compression loss at locations far from the imaging center. These nRMSE values showed that SBSCC had much better compression performance than SCC for a fixed number of virtual coils.

Figure 3:
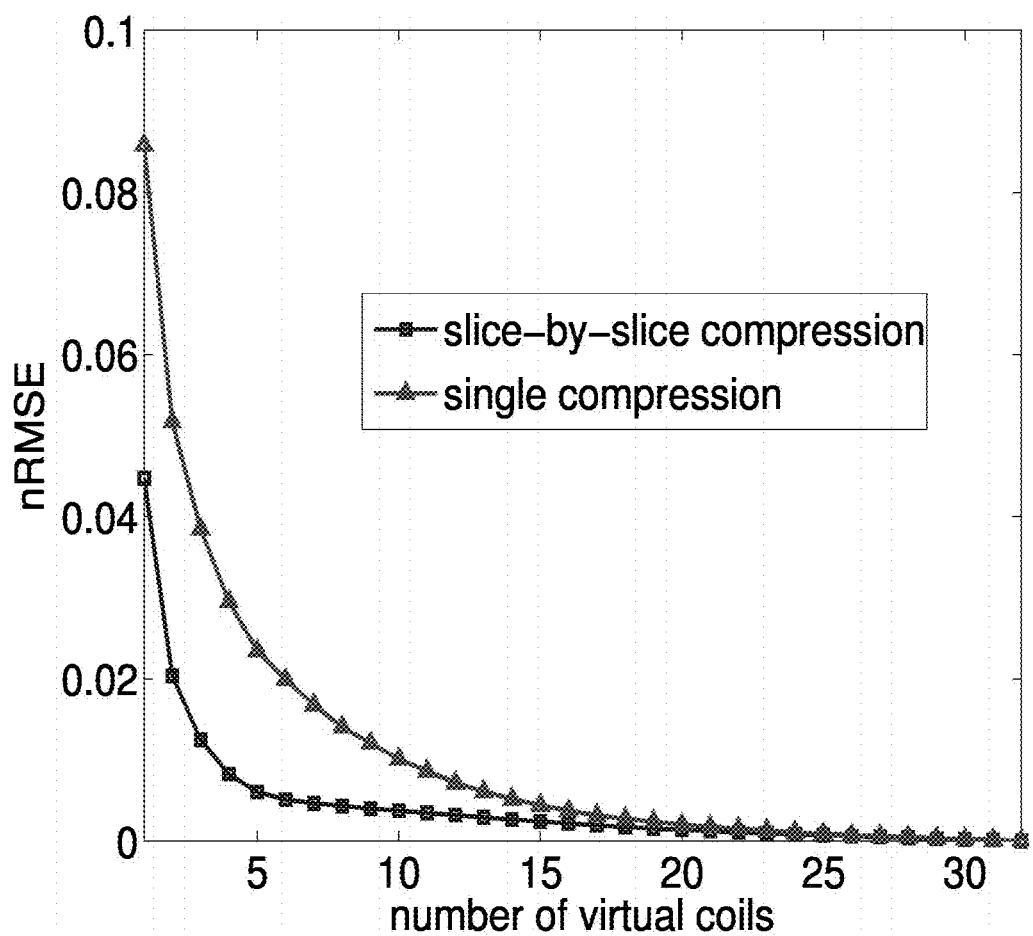
FIG. 3 shows the normalized root mean square error (nRMSE) plotted as a function of the number of virtual coils.

The number of virtual coils was then set from 1 to 32, and the corresponding nRMSE values were calculated for the two coil compression methods. The nRMSE was plotted as a function of the number of virtual coils in FIG. 3. All the 3D data were used for nRMSE calculation. Data from 32 original coils were used as the reference. In FIG. 3, we can see that SCC always had larger compression error than SBSCC. In order to achieve the same level of compression error as SBSCC, more virtual coils were needed for SCC. This is due to the fact that SCC cannot effectively incorporate the spatially-varying coil sensitivities. FIG. 3 also shows that SBSCC only needed 6 virtual coils to represent the same information from the 32 original coils, while SCC needed 15 virtual coils.

Coil Compression Matrices Alignment

Figure 4:
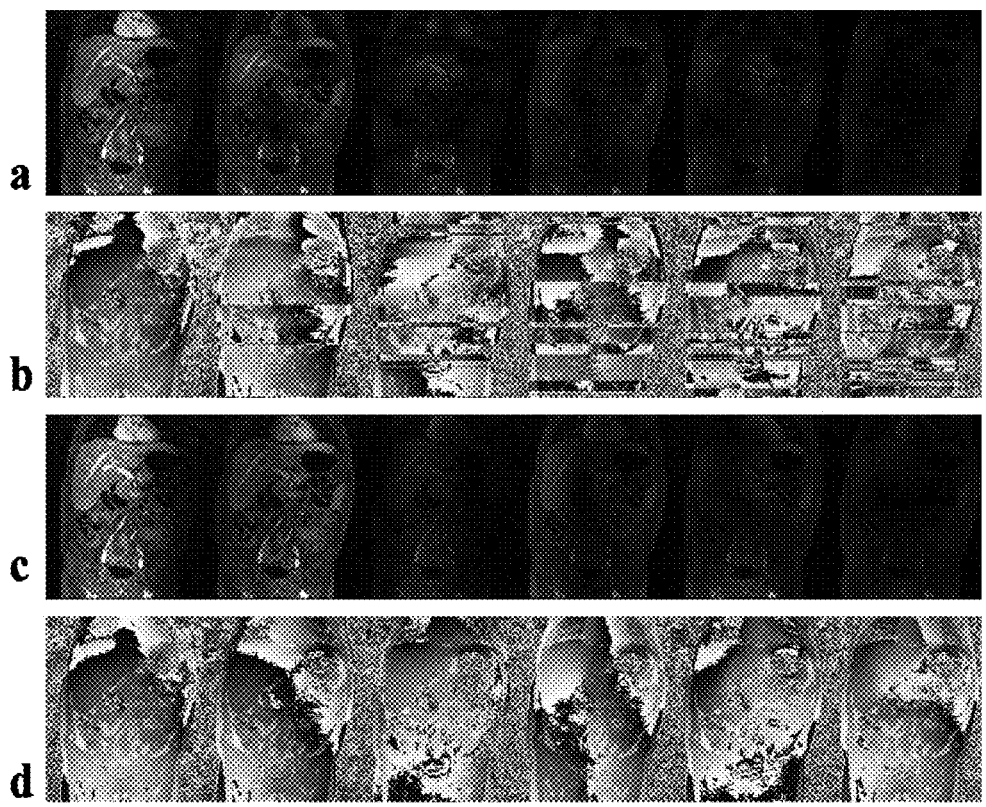
FIGS. 4a-d show the magnitude and phase images of the 6 virtual coils from SBSCC with and without proper alignment.
Figure 5A:
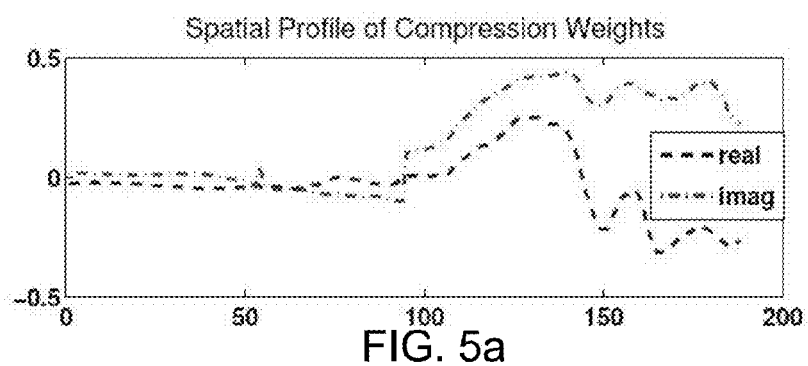
FIGS. 5a-b show an example of a slice-varying compression weight of a virtual coil 3 from an original coil 2.
Figure 5B:
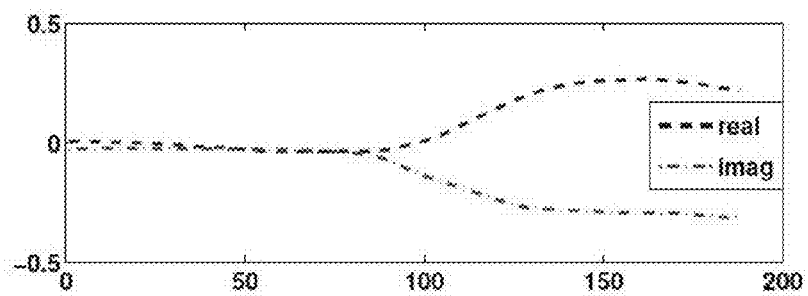

The magnitude and phase images of the 6 virtual coils from SBSCC with and without proper alignment are shown in FIGS. 4a-d. FIGS. 4a,b show magnitude and phase images of individual virtual coils 1 to 6 by SBSCC without alignment. FIGS. 4a,b show abrupt changes along x direction in both magnitude and phase images without coil compression matrices alignment. This indicates that the coil sensitivities of the virtual coils were not smooth, which is problematic for the calibration step in autocalibrating PI reconstructions. FIGS. 4c,d show magnitude and phase images of individual virtual coils 1 to 6 by SBSCC after alignment. With proper alignment, the magnitude and phase images, FIGS. 4c,d looked like those from actual coils, and were smooth enough for the calibration. The compression weights were also much more smooth after alignment. After alignment of the compression matrices, the image from an individual virtual coil no longer had abrupt random phase jumps or discontinuous coil sensitivity. The smooth coil sensitivities enable the direct application of autocalibrating PI on the virtual coils. As an example, the spatial profile of the compression weights of virtual coil 3 from original coil 2 along the slices is plotted in FIGS. 5a-b. FIG. 5a shows the compression weights along the readout direction without compression matrix alignment. FIG. 5b shows the compression weights after alignment. The spatial profile became smoother in FIG. 5b although the compression matrices alignment operation itself was not a smoothing approximation. After alignment, the spatial profile of the compression weight also indicated the contribution of the original coils to the virtual coils.

Reconstruction of the Virtual Coils

Figure 6:
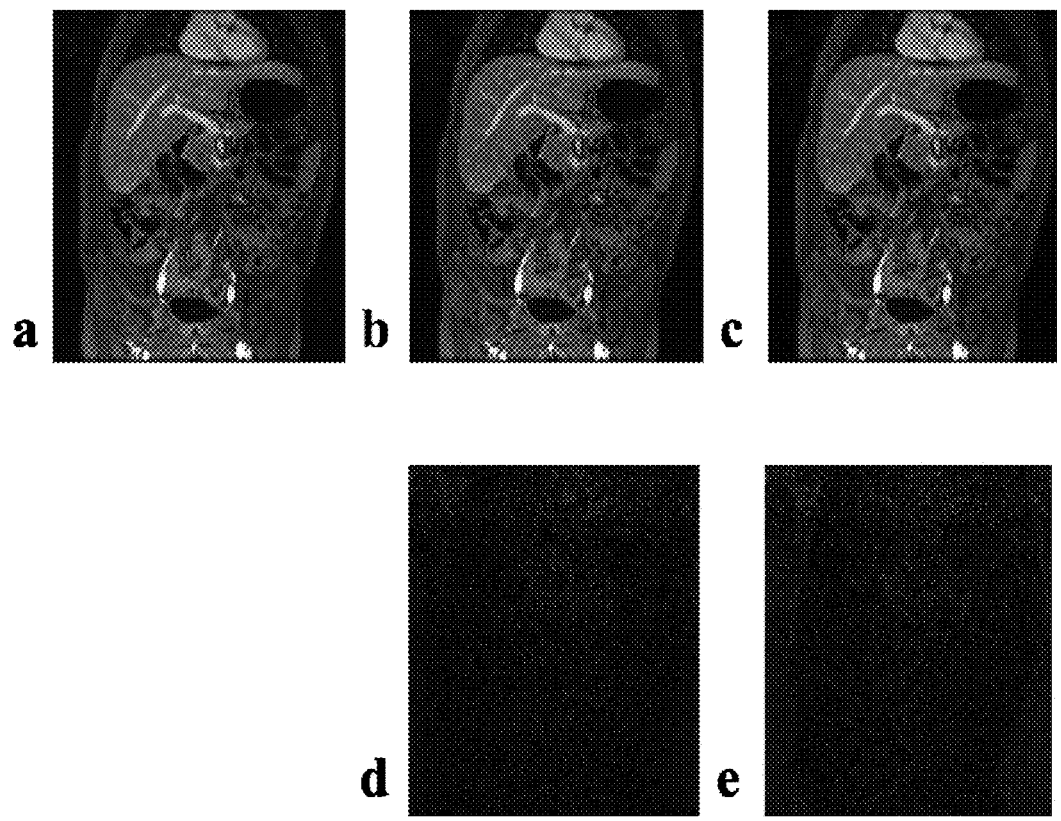
FIGS. 6a-e show reconstruction results by ARC with and without SBSCC.

ARC reconstruction was applied in the experiment with uniform undersampling of the fully sampled dataset. The ARC reconstructions with 32 original coils and 6 virtual coils were carried out separately. The total reconstruction times (including coil compression) were 876 seconds and 55 seconds respectively. Coil compression accelerated the reconstruction by approximately a factor of 16. FIGS. 6a-e show reconstruction results by ARC with and without SBSCC. FIG. 6a shows the reference image of the fully sampled data using 32 original coils. FIG. 6b shows the ARC reconstruction results of 32 original coils. FIG. 6c shows the ARC reconstruction results of 6 virtual coils. FIG. 6d shows the difference image between FIG. 6a and FIG. 6b (window/level decreased by 5×). FIG. 6e shows the difference image between FIG. 6a and FIG. 6c (window/level decreased by 5×). The reconstruction results in the two cases were very similar and the difference images FIG. 6d and FIG. 6e are very close. Compared with the fully sampled data as the reference, the nRMSEs of ARC reconstructions (R=3.7) were 0.008 with 32 original coils and 0.010 with 6 virtual coils. The reconstruction errors were very small in both cases.

The second dataset with random undersampling was reconstructed by $l_1$-SPIRiT both with and without SBSCC. The analytical formula, numerical examples, and actual reconstruction time of every step in $l_1$-SPIRiT are shown in Table 1, where $G_x$, $G_y$ and $G_z$ are the kernel size in $k_x$, $k_y$, and $k_z$ direction respectively; and $N_i$ is the number of iterations in $l_1$-SPIRiT. Table 1 shows that coil compression theoretically reduces the calibration computation by a factor of over 100, and data synthesis by a factor of 28. Data synthesis was performed on GPGPU, and the actual time spent was reduced by a factor of 6. SBSCC did require extra computation, but it was very fast, and negligible compared to $l_1$-SPIRiT reconstruction. The total reconstruction time was reduced from 652 seconds to 46 seconds. The reconstruction time was speeded up by approximately a factor of 14 and became clinically practical.

Figure 7:
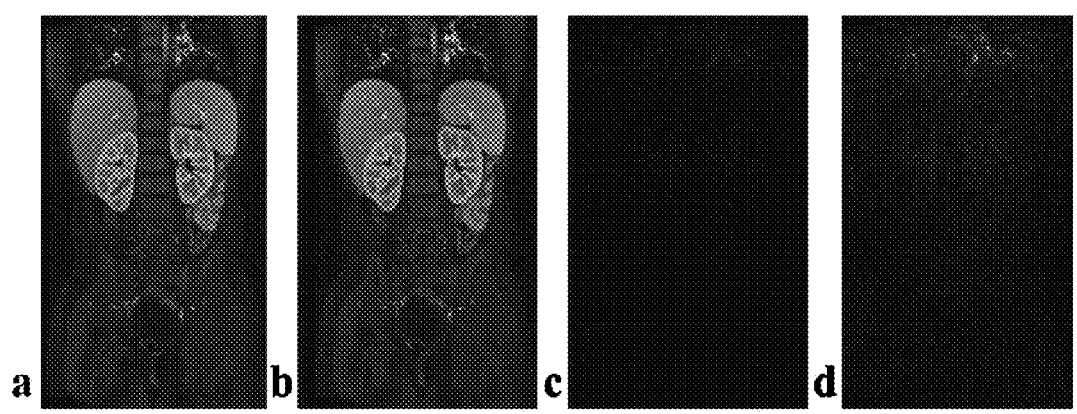
FIGS. 7a-d show the in vivo reconstruction results by $l_1$-SPIRiT both with and without SBSCC.

The reconstruction results are shown in FIGS. 7a-d, which show the in vivo reconstruction results by $l_1$-SPIRiT both with and without SBSCC. The reconstruction results in two cases had very similar image quality. FIG. 7a shows the reconstruction of $l_1$-SPIRiT with 32 original coils. FIG. 7b shows the reconstruction off $l_1$-SPIRiT with 6 virtual coils. FIG. 7c shows the difference image between FIG. 7a and FIG. 7b. FIG. 7d shows the difference image (window/level decreased by 5×) between FIG. 7a and FIG. 7b. The nRMSE was 0.009 in this coronal location. A very small difference was noticeable between the two reconstructions.

TABLE 1

| | Method | $l_1$-SPIRiT | $l_1$-SPIRiT SBSCC |
|---|---|---|---|
| SBSCC SVD | Generalized Formula | — | $N_xN_yN_C^2$ |
| | Numerical Example | — | $1.5 \times 10^8$ |
| | Actual Time (seconds) | — | 2 |
| SBSCC Compression | Generalized Formula | — | $\frac{1}{R}N_xN_yN_zN_CN'_C$ |
| | Numerical Example | — | $5.3 \times 10^8$ |
| | Actual Time (seconds) | — | 3.5 |
| Calibration | Generalized Formula | $N_cN_t(G_xG_yG_zN_c)^2$ | $N_C'N_t(G_xG_yG_zN_C')^2$ |
| | Numerical Example | $9.4 \times 10^{11}$ | $6.3 \times 10^9$ |
| | Actual Time (seconds) | 516 | 4 |
| Data Synthesis | Generalized Formula | $N_tN_xN_yN_zN_C^2$ | $N_tN_xN_yN_zN_C'^2$ |
| | Numerical Example | $5.7 \times 10^{11}$ | $2.0 \times 10^{10}$ |
| | Actual Time (seconds) | 130 | 22 |

Table 2 shows actual reconstruction times that allow comparisons between embodiments of the invention and control tests without the inventive compression. For an embodiment using ARC, the compression reduces processing time from 14.6 minutes to 1 minute. For an embodiment using $l_1$-SPIRiT, the compression reduces processing time from 11 minutes to 0.75 minutes.

TABLE 2

Reconstruction time comparison

| Acceleration | 2 × 2 uniformly under-sampled | | 2 × 2 randomly under-sampled | |
|---|---|---|---|---|
| Matrix size | 192 × 224 × 184 × 32 | | 320 × 208 × 164 × 32 | |
| Methods | ARC (32 coils) | ARC (6 virtual coils) | $l_1$-SPIRiT (32 coils) | $l_1$-SPIRiT (6 virtual coils) |
| Total time (s) | 876 (14.6 mins) | 55 (1 min) | 652 (11 mins) | 45 (0.75 mins) |

Discussion

An embodiment of the invention provides a slice-by-slice coil compression. Since the compression matrices are calculated from the ACS, the size of the matrices is small. The compression matrices alignment also requires matrix operation with very small size. Therefore the computation time of coil compression is very short compared to that of autocalibrating PI and CS. With fewer coils in the reconstruction, the total reconstruction time has been significantly reduced.

Optimal SNR can be achieved by a sum of squares coil combination after prewhitening. The prewhitening before coil compression is very useful. After prewhitening, the noise in each coil is independently identically distributed (IID). As long as the coil compression matrix A has the property of $A^HA=I$, the noise in each virtual coil is also IID, independent of the compression matrix. In SBSCC, different coil compression matrices are applied at different spatial locations, but since those compression matrices all satisfy $A^HA=I$, the noise distribution is IID in the entire virtual coils, which is independent of the spatial locations.

A fundamental difference between this embodiment of the invention and other software coil compression methods is that the spatially varying coil sensitivities have been taken into consideration. The optimal compression is achieved at different spatial locations, and different compressions are accurately aligned so that the virtual coil sensitivities are smooth. SBSCC can effectively minimize the number of virtual coils for 3D datasets, and therefore minimize the PI or CS reconstruction time.

CONCLUSION

Data-based coil compression can transform signals from large number of original coils into fewer virtual coils, without the direct measurements of coil sensitivities. A slice-by-slice coil compression technique for 3D acquisition with Cartesian sampling has been provided in an embodiment of the invention. An embodiment of the invention can minimize the number of virtual coils without noticeable compression loss. The compression matrices are well-aligned to achieve smooth virtual coil sensitivities. Autocalibrating parallel imaging and compressed sensing reconstruction can be directly carried out on the virtual coils, which significantly reduce reconstruction time. The image quality is very comparable to reconstructions using the original coils. Based on the experiment results, a 32-channel pediatric coil can be effectively compressed into 6 virtual coils with very similar image quality by the proposed method.

Figure 8:
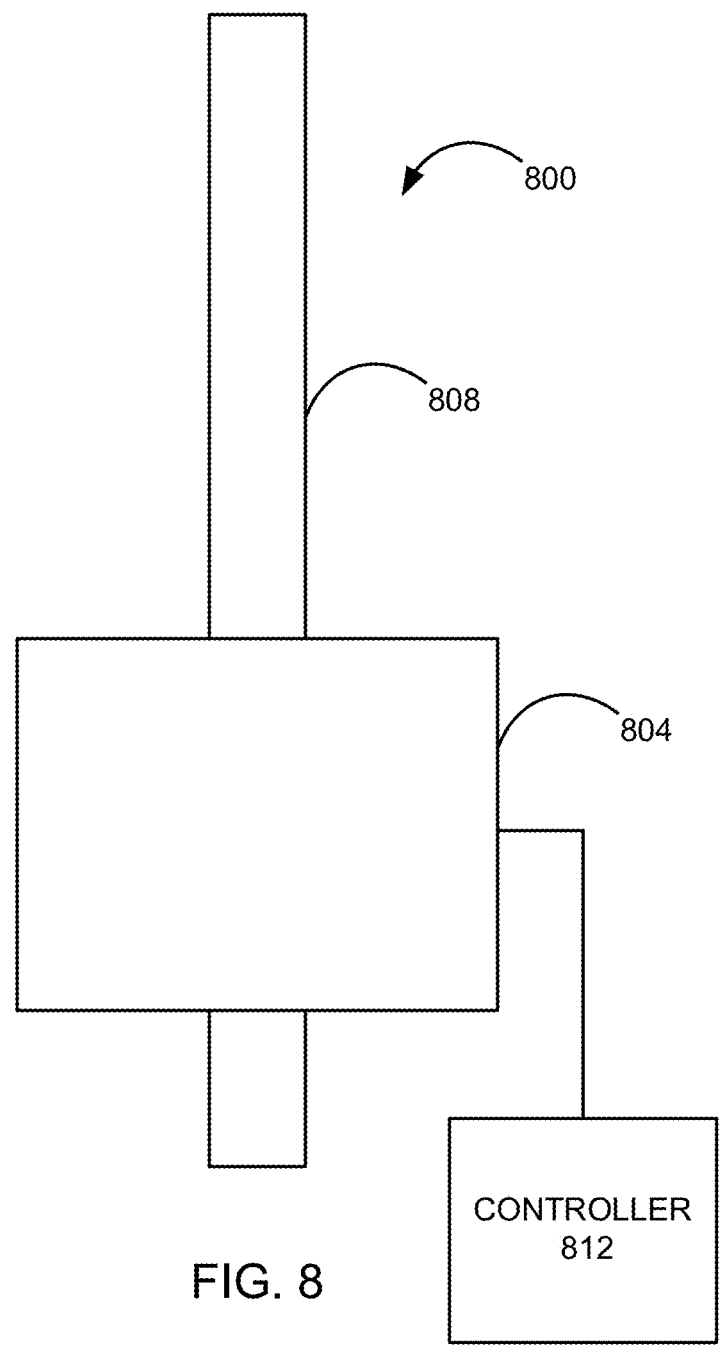
FIG. 8 is a schematic top view of a magnetic resonance imaging (MRI) system that may be used in an embodiment of the invention.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804.

Figure 9:
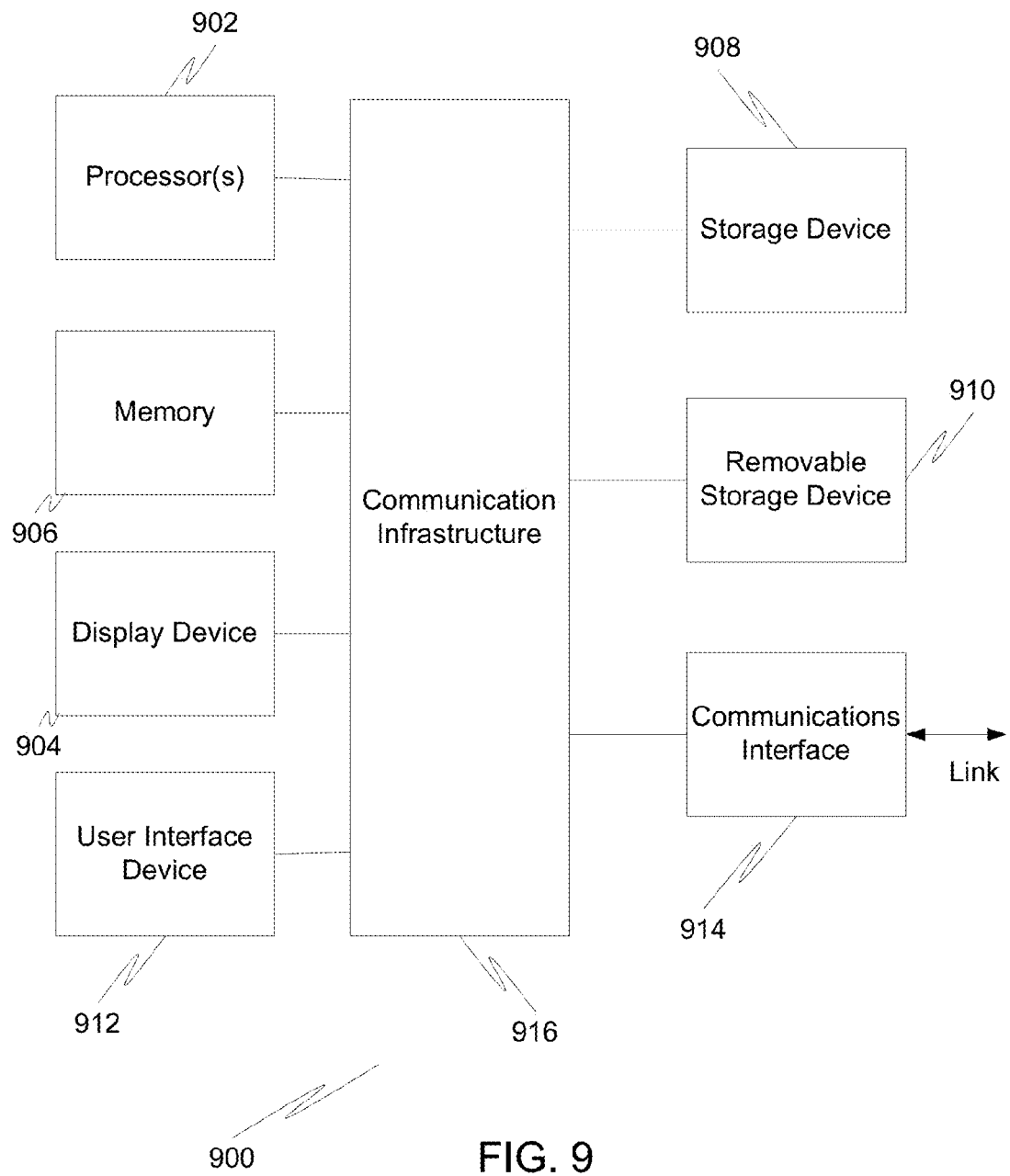
FIG. 9 illustrates a computer system that may be used in an embodiment of the invention.

FIG. 9 is a high level block diagram showing a computer system 900, which is suitable for implementing a controller 812 used in embodiments of the present invention. The computer system may have many physical forms ranging from an integrated circuit, a printed circuit board, and a small handheld device up to a huge super computer. The computer system 900 includes one or more processors 902, and further can include an electronic display device 904 (for displaying graphics, text, and other data), a main memory 906 (e.g., random access memory (RAM)), storage device 908 (e.g., hard disk drive), removable storage device 910 (e.g., optical disk drive), user interface devices 912 (e.g., keyboards, touch screens, keypads, mice or other pointing devices, etc.), and a communication interface 914 (e.g., wireless network interface). The communication interface 914 allows software and data to be transferred between the computer system 900 and external devices via a link. The system may also include a communications infrastructure 916 (e.g., a communications bus, cross-over bar, or network) to which the aforementioned devices/modules are connected.

Information transferred via communications interface 914 may be in the form of signals such as electronic, electromagnetic, optical, or other signals capable of being received by communications interface 914, via a communication link that carries signals and may be implemented using wire or cable, fiber optics, a phone line, a cellular phone link, a radio frequency link, and/or other communication channels. With such a communications interface, it is contemplated that the one or more processors 902 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 10:
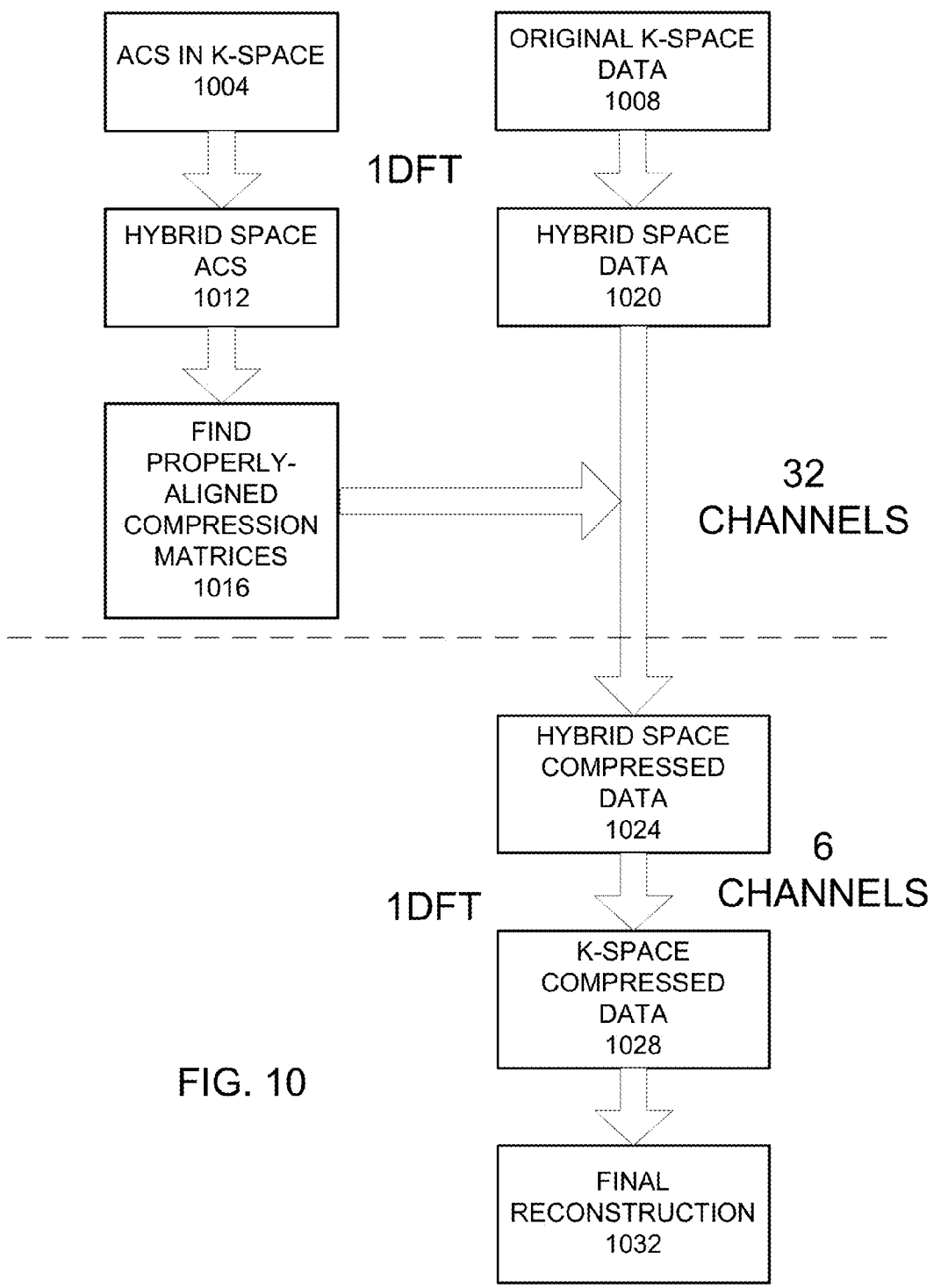
FIG. 10 is a block diagram of a preferred embodiment of the invention.

FIG. 10 is a block diagram of a preferred embodiment of the invention. A 3D acquisition of k-space data is performed with a region within an auto calibration signal (ACS) (step 1004). In this example 32 coils are used to provide 32 channels. A 3D acquisition of k-space data is performed with a region outside of the ACS (step 1008), also using 32 channels. The ACS k-space data are converted into hybrid space ACS data (step 1012). Properly-aligned compression matrices are found for the hybrid space ACS data along the readout direction (step 1016). All k-space data are converted into hybrid space data outside of the ACS (step 1020). The properly-aligned compression matrices are applied to the hybrid space data outside of the ACS to provide hybrid space compressed data (step 1024), which in this example has 6 virtual channels. The hybrid space compressed data are transformed to k-space compressed data (step 1028). The compressed data are used to form a 3D image (step 1032).

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A computer implemented method for providing a three dimensional image, in a phased array magnetic resonance imaging (MRI) system, comprising:
   acquiring three dimensional k-space data within an auto-calibration signal (ACS) region and outside the ACS region;
   converting the k-space data within the ACS region into hybrid space ACS data;
   finding compression matrices for the hybrid space ACS data along a readout direction;
   finding alignment matrices of the compression matrices along the readout direction;
   multiplying alignment matrices to the compression matrices to achieve the properly-aligned compression matrices along the readout direction;
   converting the k-space data into hybrid space data;
   applying the properly-aligned compression matrices to the hybrid space data to provide compressed data with fewer channels; and
   using the compressed data to form a three dimensional image.

2. The computer implemented method, as recited in claim 1, wherein within the ACS region the k-space data is fully sampled and wherein outside of the ACS region the k-space data is fully sampled in the readout direction but under sampled in both phase encoding directions.

3. The computer implemented method, as recited in claim 2, wherein the using the compressed data to form a three dimensional image comprises converting the compressed data into k-space.

4. The computer implemented method, as recited in claim 3, wherein the using the compressed data to form a three dimensional image comprises using autocalibrating parallel imaging or compressed sensing methods to reconstruct the compressed data.

5. The computer implemented method, as recited in claim 3, wherein the finding compression matrices for the hybrid space ACS data along the readout direction, comprises:

$$\text{minimizing } N'_C$$
$$\text{subject to } \quad v'(r) = v(r)P,$$
$$P\,P^H = P^H\,P = I,$$
$$|v'_i(r)|_2 < \epsilon,\; i = N'_C + 1, \ldots, N_c$$

where $N_c$ is an original number of coils in data acquisition and at each location r in k-space at each readout position, and $v(r)=[v_1(r), v_2(r), \ldots, v_{N_c}(r)]$ defines a vector that represents data at this location from all the original coils, and where P is a $N_c \times N_c$ orthogonal matrix, and H is the conjugate transpose of a matrix, $v'(r)=[v'_1(r), v'_2(r), \ldots, v'_{N_c}(r)]$, which is a vector at the same location from virtual coil 1 to $N_c$, and $N'_C$ is the number of effective virtual coils, and wherein $\epsilon$ is compression error.

6. The computer implemented method, as recited in claim 5, wherein the finding the alignment matrices of the compression matrices, comprises:

$$\text{minimizing } \sum_{i=2}^{N_x} \|A^i - A^{i-1}\|_F^2$$
$$\text{subject to } \quad A^i = V_A^i P^i,$$
$$P^i(P^i)^H = (P^i)^H P^i = I, (i = 1, 2, \ldots, N_x)$$

where the variables are $A^i$ and $P^i$, and $\|A^i - A^{i-1}\|_F$ is the Frobenius norm of matrix $(A^i - A^{x-1})$ and $V_A^i$ is a $N_c \times N_c$ unitary input matrix for alignment matrix $A^i$ at the i-th slice.

7. The computer implemented method, as recited in claim 6, wherein v(r) is prewhitened.

8. The method, as recited in claim 7, wherein the using the compressed data to form a three dimensional image comprises using autocalibrating parallel imaging or compressed sensing to reconstruct the compressed data.

9. The computer implemented method, as recited in claim 3, wherein the finding compression matrices $A^i$ for the hybrid space ACS data for each slice at each slice i (i=1, 2, ..., $N_x$) along the readout direction, comprises:
   a) at the ith slice, reformat the ACS in data matrix $D_h$ from each original coil into vectors $X^i_1, X^i_2, \ldots, X^i_{Nc}$, which defines matrix $X^i = [X^i_1, X^i_2, \ldots, X^i_{Nc}]$;
   b) perform a singular value decomposition (SVD) of $X^i$:

$$X^i = U^i \Sigma^i (V^i)^H \qquad (9)$$

where $V^i$ is the $N_c \times N_c$ unitary input matrix, where the compression matrix $A^i$ is initialized as $V_A^i$;

c) repeating steps a and b until compression matrices are calculated for all slides.

10. The computer implemented method, as recited in claim 9, wherein the finding the alignment matrices, comprises finding an orthogonal matrix $P^i$ at each slice, so that the resulting compression matrices $A^i$ are smooth in x direction, comprising:
   a) assuming $P^{i-1}$ (and $A^{i-1}$) is known at slice i−1, and $P^i$ is to be solved for slice I;
   b) defining matrix $C^i=(A^{i-1})^H V_A^i$;
   c) performing SVD of matrix $C^i$ (size: $N'_c \times N'_c$);

$$C^i = U_C^i \sum_C^i (V_C^i)^H;$$

d) set $P^i = V_C^i (U^i_C)^H$ and $A^i = V_A^i P^i$;
   e) repeat steps b-d for all slices.

11. The computer implemented method, as recited in claim 10, wherein coil compression matrix A has the property of $A^H A = I$.

12. The computer implemented method, as recited in claim 11, wherein the using the compressed data to form a three dimensional image comprises using autocalibrating parallel imaging or compressed sensing to reconstruct the compressed data.

13. The computer implemented method, as recited in claim 10, wherein the using the compressed data to form a three dimensional image comprises using $l_1$-SPIRiT or ARC.

14. The computer implemented method, as recited in claim 3, wherein the using the compressed data to form a three dimensional image comprises using $l_1$-SPIRiT or ARC.

15. A computer implemented method for providing a three dimensional image, in a phased array magnetic resonance imaging (MRI) system, comprising:
   acquiring three dimensional k-space data within an autocalibration signal (ACS) region and outside the ACS region, wherein within the ACS region the k-space data are fully sampled and wherein outside of the ACS region the k-space data are fully sampled in a readout direction but under sampled in both phase encoding directions;
   converting the k-space data within the ACS region into hybrid space ACS data;
   finding compression matrices for the hybrid space ACS data along the readout direction;
   finding alignment matrices of the compression matrices along the readout direction;
   multiplying alignment matrices to the compression matrices to achieve the properly-aligned compression matrices along the readout direction;
   converting the entire k-space data into hybrid space data;
   applying the properly-aligned compression matrices to the hybrid space data to provide compressed data with fewer channels; and
   using the compressed data to form a three dimensional image, using autocalibrating parallel imaging or compressed sensing methods to reconstruct the compressed data.

16. The computer implemented method, as recited in claim 15, wherein the using the compressed data to form a three dimensional image comprises using $l_1$-SPIRiT or ARC.

17. The computer implemented method, as recited in claim 15, wherein the finding compression matrices for the hybrid space ACS data along the readout direction, comprises:

minimizing $N'_C$ subject to  $v'(r) = v(r)P$, $P P^H = P^H P = I$, $|v'_i(r)|_2 < \epsilon, i = N'_C + 1, \ldots, N_c$ where N is an original number of coils in data acquisition and at each location r in k-space at each readout position, and $v(r)=[v_1(r), v_2(r), \ldots, v_{N_c}(r)]$ defines a vector that represents data at this location from all the original coils, and where P is a $N_c \times N_c$ orthogonal matrix, and H is the conjugate transpose of a matrix, $v'(r)=[v'_1(r), v'_2(r), \ldots, v'_{N_c}(r)]$, which is a vector at the same location from virtual coil 1 to $N_c$, and $N'_C$ is the number of effective virtual coils, and wherein cis compression error.

18. The computer implemented method, as recited in claim 17, wherein the finding the alignment matrices of the compression matrices, comprises:

minimizing $\sum_{i=2}^{N_x} \| A^i - A^{i-1} \|_F^2$ subject to  $A^i = V_A^i P^i$, $P^i (P^i)^H = (P^i)^H P^i = I, (i = 1, 2, \ldots, N_x)$ where the variables are $A^i$ and $P^i$, and $\|A^i - A^{i-1}\|_F$ is the Frobenius norm of matrix $(A^i - A^{i-1})$ and $V_A^i$ is a $N_c \times N_c$ unitary input matrix for alignment matrix $A^i$ at the i-th slice.

19. The computer implemented method, as recited in claim 15, wherein v(r) is prewhitened.

* * * * *